United States Patent [19]
Zambrano

[11] Patent Number: 5,426,320
[45] Date of Patent: Jun. 20, 1995

[54] INTEGRATED STRUCTURE PROTECTION DEVICE FOR PROTECTING LOGIC-LEVEL POWER MOS DEVICES AGAINST ELECTRO-STATIC DISCHARGES

[75] Inventor: Raffaele Zambrano, San Giovanni La Punta, Italy

[73] Assignee: Consorzio Per La Ricera Sulla Microelectronica Nel Mezzogiorno, Catania, Italy

[21] Appl. No.: 225,147

[22] Filed: Apr. 8, 1994

[30] Foreign Application Priority Data

Apr. 21, 1993 [EP] European Pat. Off. ............ 93830169

[51] Int. Cl.⁶ .................... H01L 29/06; H01L 29/78; H01L 29/10
[52] U.S. Cl. .................................. 257/328; 257/336; 257/337; 257/341; 257/361; 257/362
[58] Field of Search ............... 257/328, 336, 337, 341, 257/361, 361

[56] References Cited

U.S. PATENT DOCUMENTS

| 3,999,212 | 12/1976 | Usuda . | |
| 4,072,975 | 2/1978 | Ishitani | 257/328 |
| 4,890,143 | 12/1989 | Baliga et al. . | |
| 4,963,970 | 10/1990 | Throngnumchai et al. | 257/328 |
| 5,045,902 | 9/1991 | Bancal | 257/328 |

FOREIGN PATENT DOCUMENTS

| 58-021374 | 2/1983 | Japan . | |
| 58-058769 | 4/1983 | Japan . | |
| 61-156856 | 7/1986 | Japan . | |
| 61-296770 | 12/1986 | Japan | 257/328 |
| 62-211954 | 9/1987 | Japan | 257/328 |
| 63-265470 | 11/1988 | Japan | 257/328 |
| 4-280670 | 10/1992 | Japan | 257/328 |

*Primary Examiner*—Ngân V. Ngô
*Attorney, Agent, or Firm*—Seed and Berry

[57] ABSTRACT

An integrated structure protection device suitable for protecting a power MOS device from electrostatic discharges comprises a junction diode comprising a first electrode made of a highly doped region of a first conductivity type surrounded by a body region of a second conductivity type and representing a second electrode of the junction diode, which in turn is surrounded by a highly doped deep body region of said second conductivity type. The highly doped region is connected to a polysilicon gate layer representing the gate of the power MOS device, while the deep body region is connected to a source region of the power MOS.

14 Claims, 4 Drawing Sheets

INTEGRATED STRUCTURE PROTECTION DEVICE FOR PROTECTING LOGIC-LEVEL POWER MOS DEVICES AGAINST ELECTRO-STATIC DISCHARGES

TECHNICAL FIELD

The present invention relates to an integrated structure protection device for the protection of logic-level power MOS (MOSFET, IGBT and so on) devices against electro-static discharges.

BACKGROUND OF THE INVENTION

MOS devices are more and more employed in power electronics thanks to the simplicity of the circuits necessary for their driving operation and to their switching performances.

Among power MOS devices, those which can be directly driven by logic-level signals (called logic-level power MOS) hold a significant market share. In their most common use, logic-level power MOS devices can be directly driven by a microprocessor.

Since it is known that most logic families have logic-level voltage values compatible with those of the TTL technology, it follows that logic-level power MOS devices must have threshold voltage values ranging from 1 V to 2 V: in fact, they must remain in the "off" state for gate driving voltages between 0 V and 0.8 V (corresponding to the "0" logic level), while they drain the nominal current when the gate voltage is higher than 2.4 V (corresponding instead to the "1" logic level).

Due to the low value of the threshold voltage, these devices are labeled with the letters LT (Low Threshold).

In order to achieve said threshold voltage values, it is necessary for logic-level MOS power devices to have a gate oxide layer that is rather thin, with thickness typically ranging from 30 nm to 80 nm. Such a thin layer can be permanently damaged if a voltage higher than a few tens of volts is applied to the gate of the device. For this reason logic-level power MOS are particularly affected by Electro-Static Discharges ("ESD") problems.

To prevent ESD failures, manufacturers of logic-level power MOS devices provide said devices with integrated structure protections, usually made up of diodes.

Such protections, however, set two opposing kind of limits: the first is represented by the breakdown voltage of each of said diodes, while the second deals with the series resistance introduced by the diodes.

Each diode should have a breakdown voltage higher than the maximum driving voltage of the power MOS device, in order to prevent it from draining current from the driving circuit of the power MOS device. Since diodes obtained from p+/n+ junctions exhibit low breakdown voltages (with values even below 5 V), it is necessary to connect a plurality of such diodes in series.

Another possibility is represented by the use of p/n+ junction diodes, which generally have breakdown voltages of the order of 10 V.

If, however, the series resistance introduced by the protection structure is not negligible, it can give rise to a voltage drop able to damage the protected power device during an electro static discharge.

SUMMARY OF THE INVENTION

In view of the state of art described, the object of the present invention is to provide an integrated structure protection device suitable for protecting logic-level power MOS devices during electrostatic discharges, which is not affected by the abovementioned problems.

According to the present invention, such object is attained by means of an integrated structure protection device comprising a junction diode, obtained on a substrate of a semiconductor material on which a power MOS device is also obtained, said junction diode comprising a first electrode made of a highly doped region of a first conductivity type connected to a gate layer of said power MOS device and extending from a top surface of the substrate within a doped body region of a second opposite conductivity type, which represents a second electrode of said junction diode and extends into the substrate from said top surface, characterized in that a highly doped annular deep body region of said second conductivity type surrounds said body region and is connected to source regions of said power MOS device.

In a first embodiment of the present invention said deep body region is physically set apart from said source regions of the power MOS device, and the connection to them is carried out by means of a superimposed conductive layer coincident with a source electrode.

In a second embodiment of the present invention said source region of the power MOS device is obtained inside said deep body region of the junction diode.

Thanks to the structure according to the present invention, particularly to the deep body region surrounding the anode of the junction diode, it is possible to obtain an integrated structure protection diode having a breakdown voltage in the range of 10 V, and with low series resistance. Moreover, the area occupied by this protection device is very small, particularly when the second embodiment is utilized.

BRIEF DESCRIPTION OF THE DRAWINGS

The two abovementioned solutions will now be described in detail with reference to the annexed drawings.

DETAILED DESCRIPTION OF THE INVENTION

Figure 1:
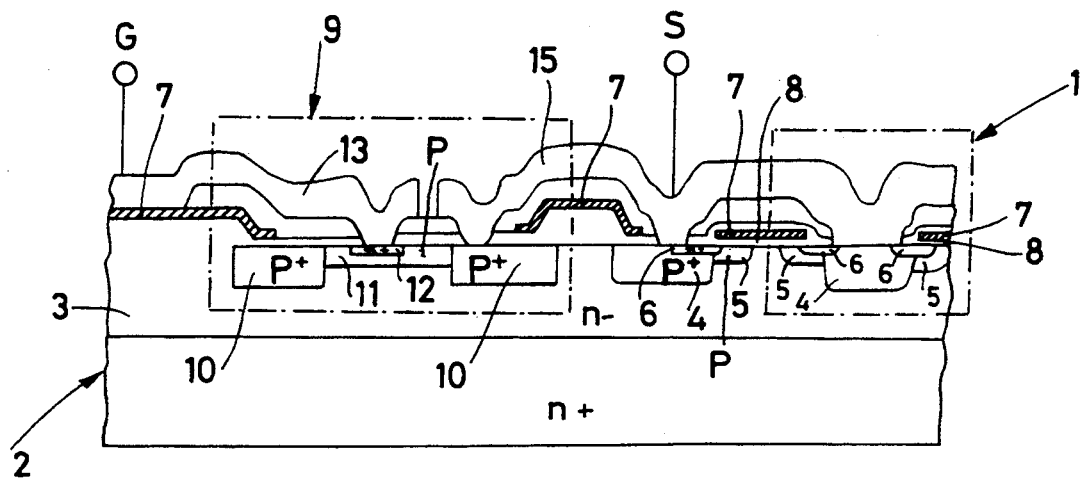
FIG. 1 shows in cross-section an integrated structure protection device according to a first embodiment of the present invention.

With reference to the drawings, a known power MOS (MOSFET-type) device is made up of a plurality of cells 1 obtained on a substrate 2 of a semiconductor material, for example of the n+ type, with superimposed thereon an epitaxial layer 3 of the n− type. Each cell 1 comprises a deep p+ type region 4 contacting at least one lateral p type channel region 5, and at least one n+ type source region 6. A polysilicon gate layer 7, isolated from the top surface of the substrate 2 by a thin gate oxide layer 8, is superimposed over said p type channel region 5 and extends over said n+ type source region 6. A superimposed conductive layer 15, for example of aluminum, represents a source electrode S and contacts the substrate 2 top surface in correspondence with said deep p+ type region 4 and said n+ type source region 5. A drain electrode D (not shown) contacts a bottom surface of the substrate 2.

Figure 2:
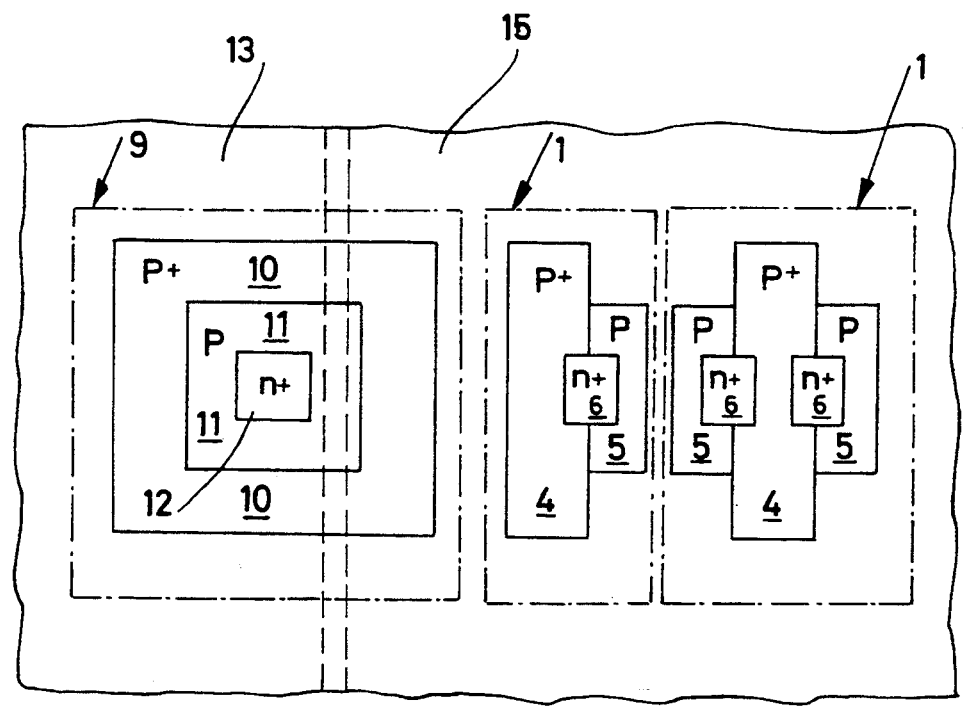
FIG. 2 is a top view of the integrated structure protection device shown in FIG. 1.

As shown in FIGS. 1 and 2, a first embodiment of the present invention provides for the fabrication of a p/n+ junction diode 9, physically set apart from all the cells 1.

The diode 9 comprises an annular p+ type deep body region 10, extending from the surface of the substrate 2 into the epitaxial layer 3 and completely surrounding a p type body region 11 representing an anode of the diode 9. Within the p type body region 11, an n+ type cathode region 12 is formed.

A gate electrode 13, for example of aluminum, contacts both the polysilicon gate layer 7 and the n+ type cathode region 12, and extends to a gate contact pad G, not shown in FIG. 2. One side of the deep body region 10 is contacted by the source electrode S, so that the n+ type source regions 6 and the deep p+ type region 4 are electrically connected to said deep body region 10.

Figure 3:
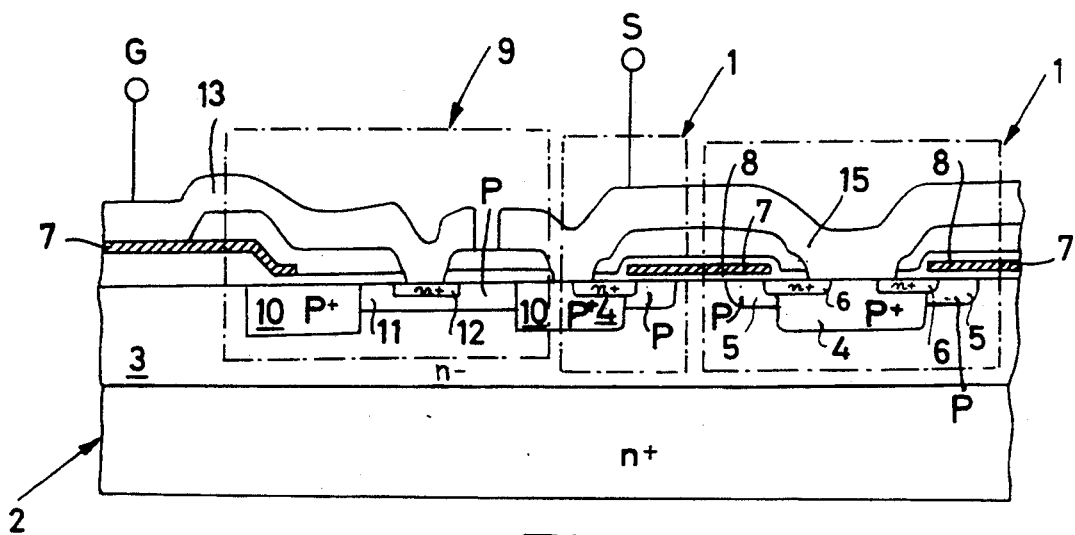
FIG. 3 shows in cross-section an integrated structure protection device according to a second embodiment of the present invention.
Figure 4:
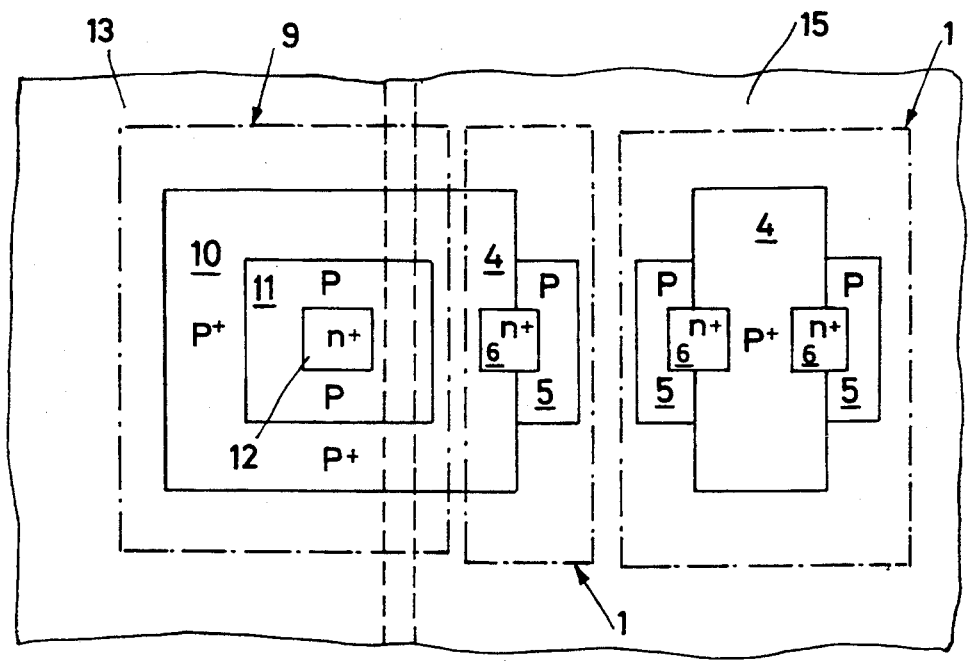
FIG. 4 is a top view of the integrated structure protection device shown in FIG. 3.
Figure 11:
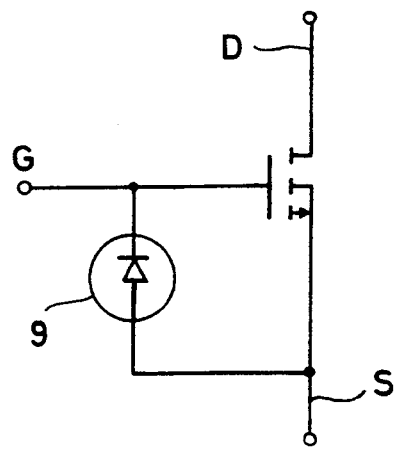
FIG. 11 is an equivalent electrical diagram of the integrated structures shown in FIGS. 1 and 3.

In a second embodiment of the present invention, shown in FIGS. 3 and 4, the annular p+ type deep body region 10 is merged with the deep p+ type region 4 of one of the cells 1 of the power MOS device, and includes a portion of the n+ type source region 6. The diode series resistance is thus further reduced, as well as the occupied area.

Figure 5:
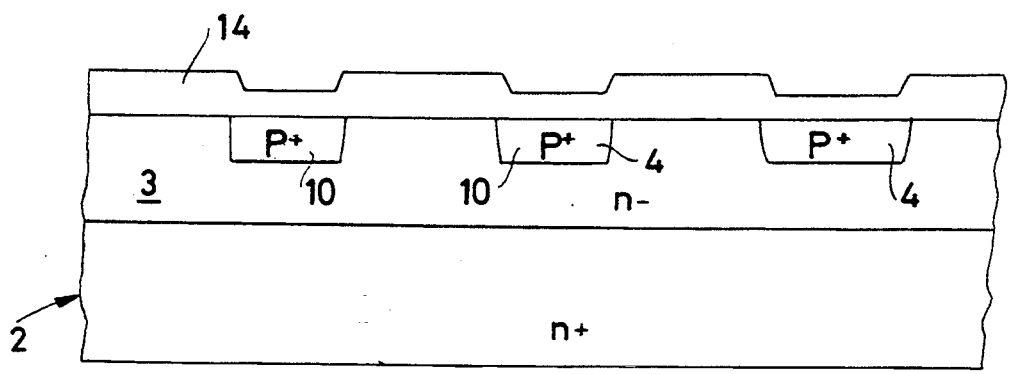
FIGS. 5–10 show cross-sectional views representing intermediate steps of the fabrication process of the integrated structure protection device according to the second embodiment of the present invention.
Figure 6:
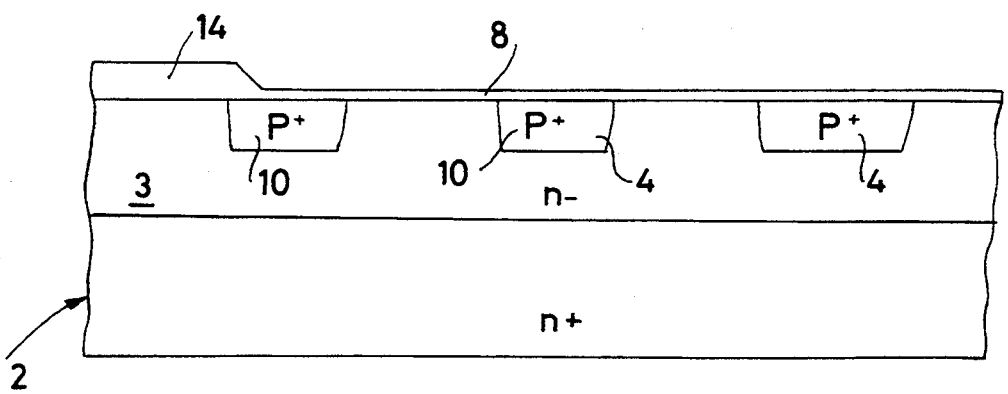
Figure 7:
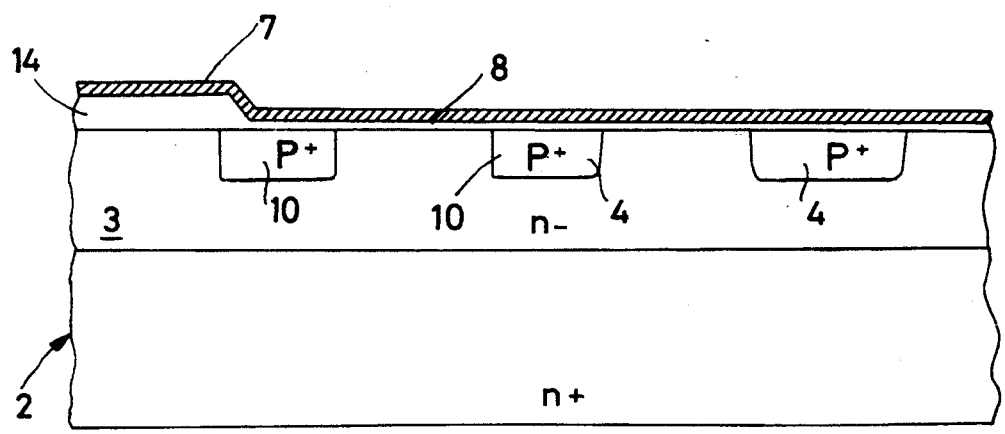

As shown in FIGS. 5 through 10, a typical process for the fabrication of a power MOSFET device featuring the integrated structure protection device of the present invention, particularly according to the second embodiment shown in FIGS. 3 and 4, begins in FIG. 5 with: (1) the growth of the n− epitaxial layer 3 over the n+ type substrate 2, (2) the growth of a field oxide layer 14, and (3) the masked implant and subsequent diffusion of a p type dopant to form a plurality of said deep p+ type regions 4 and the annular p+ type deep body region 10 of the junction diode 9.

After a masking step suitable for defining active area regions on the surface of the substrate 2, the gate oxide layer 8 is grown (FIG. 6); the polysilicon gate layer 7 is then deposited and doped (FIG. 7), and is subsequently etched to form gate regions 17.

Figure 8:
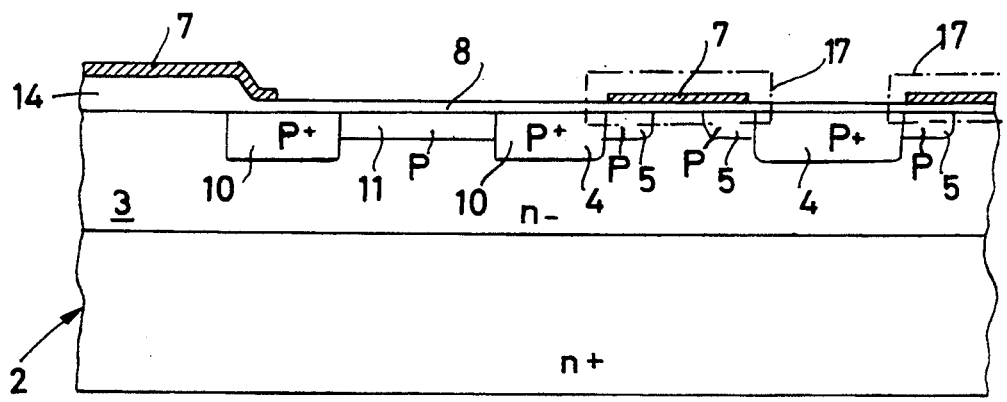

A low concentration of p type dopant is then diffused within the boundary defined by said annular p+ type deep body region 10, and under said gate regions, to form a plurality of p type channel regions 5 and the p type body region 11 representing the anode of the diode 9 (FIG. 8).

Figure 9:
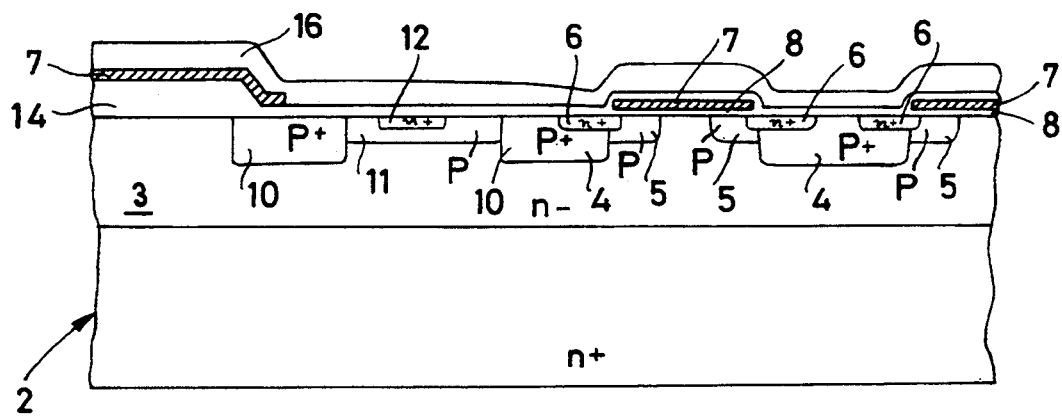
Figure 10:
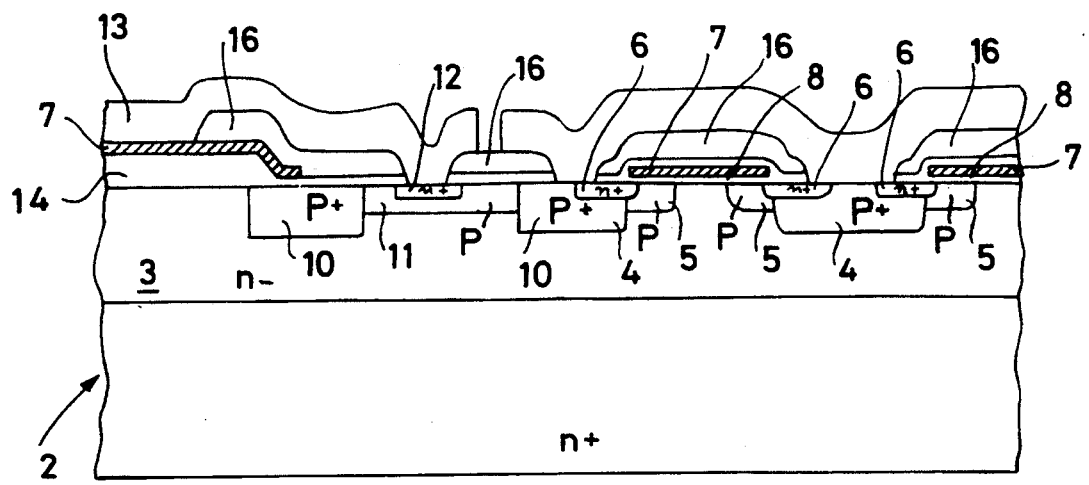

A high concentration of n type dopant is then diffused at the sides of said gate regions, and inside the p type body region 11, in order to form the n+ type source regions 6 of the plurality of cells 1 and the n+ type cathode region 12 of the diode 9. An insulating dielectric layer 16, for example of phosphosilicate glass, is then deposited on the surface (FIG. 9). After the definition of contact areas, a conductive layer, for example of aluminum, is deposited over the surface, in order to form the gate electrode 13 and the source electrode S (FIG. 10).

Using the above process, no additional steps, with respect to a known process for the fabrication of a power MOS device, are required in order to obtain the integrated structure protection device of the present invention.

Since the junction diode 9 is obtained from a p/n+ junction, it shows a breakdown voltage value of about 10 V; the p+ type deep body region 10, which surrounds the p type body region 11 representing the anode of the diode 9, reduces the series resistance of the diode 9. Experimental results have proven that the present structure is suitable for protecting the power MOS device from electro static discharges of up to 16 KVolts.

The structures of the present invention also enhance the ruggedness of the overall devices, since it prevents the formation of inversion layers (its doping is much higher than that of the region 11). The region 10 is used as a contact region for the anode of the diode 9.

While the present invention has been generally described with respect to an n-channel MOS type device, those skilled in the art will recognize that the teachings and structures according to the invention can also be used to protect Insulated Gate Bipolar Transistors (IGBTs) from the ESD, simply by starting the process flow with a p-type, heavily doped substrate, on which a n-type epilayer similar to the epilayer 3 described before has been grown. Also, the invention applies to p-channel devices; in this case it is necessary to substitute p-type regions for n-type regions and vice versa, and to reverse the diode connection to the source and gate electrodes.

Although specific embodiments of the invention have been described for purposes of illustration, various modifications may be made without departing from the spirit and scope of the invention, as is known by those skilled in the art based on the description provided herein. Accordingly, the invention is not limited by the disclosure, but instead its scope is to be determined entirely by reference to the following claims.

I claim:

1. An integrated structure protection device for the protection of a power MOS device, comprising a junction diode obtained on a substrate of a semiconductor material on which the power MOS device is also obtained, said junction diode comprising a first electrode made of a highly doped region of a first conductivity type connected to a gate layer of said power MOS device and extending from a top surface of the substrate within a doped body region of a second opposite conductivity type, which represents a second electrode of said junction diode and extends into the substrate from said top surface, characterized in that a highly doped annular deep body region of said second conductivity type is provided around said body region and is connected to source regions of said power MOS device, and that at least one of said source regions of the power MOS device is partially enclosed in said deep body region of the junction diode.

2. An integrated structure protection device according to claim 1, wherein said power MOS device is made up of a plurality of cells each comprising a highly doped deep region of said second conductivity type, at least one lateral channel region of said second conductivity type, at least one highly doped source region of said first conductivity type inside said deep region and extending into said lateral channel region, and a polysilicon gate layer, isolated from the surface of the substrate by a thin gate oxide layer superimposed over said channel region and extending over said source region, characterized in that said deep body region of the junction diode also represents the deep region of at least one of said cells, and contains the source region of said cell.

3. An integrated structure protection device according to claim 1, characterized in that said first conductivity type regions are semiconductor regions doped with donor impurities, while said second conductivity type regions are semiconductor regions doped with acceptor impurities.

4. An integrated structure protection device according to claim 3, characterized in that said highly doped region is an n+ type region of semiconductor material.

5. An integrated structure protection device according to claim 3, characterized in that said body region is a p type region of semiconductor material.

6. An integrated structure protection device according to claim 3, characterized in that said deep body region is a p+ type region of semiconductor material.

7. An integrated structure protection device according to claim 1, characterized in that said first conductivity type regions are semiconductor regions doped with acceptor impurities, while said second conductivity type regions are semiconductor regions doped with donor impurities.

8. An integrated structure protection device according to claim 7 characterized in that said highly doped region is a p+ type region of semiconductor material.

9. An integrated structure protection device according to claim 7, characterized in that said body region is an n type region of semiconductor material.

10. An integrated structure protection device according to claim 7, characterized in that said deep body region is an n+ type region of semiconductor material.

11. An integrated structure protection device according to claim 1, characterized in that said substrate is of a semiconductor material of said first conductivity type.

12. An integrated structure protection device according to claim 1, characterized in that said substrate is of a semiconductor material of said second conductivity type.

13. An integrated protection device for protecting an integrated power MOS device comprising:
a semiconductor substrate;
a source region of the power MOS device formed in an upper surface of the semiconductor substrate;
a first region of a first conductivity type formed in the upper surface of the semiconductor substrate, the first region being a first electrode of a diode;
a second region of a second conductivity type formed in an upper surface of the first region, the second region being a second electrode of the diode; and
a third annular region of the first conductivity type formed in the upper surface of the semiconductor substrate, around the first region and not contacting the second region, a portion of the third annular region being contiguous with the source region of the power MOS device, and the third annular region being electrically coupled to the source region of the power MOS device.

14. The integrated protection device of claim 13 wherein the second region of the second conductivity type is highly doped and the third annular region of the first conductivity type is highly doped, while the first region is not highly doped.

* * * * *